United States Patent [19]

Mehalel

[11] Patent Number: 5,475,633
[45] Date of Patent: Dec. 12, 1995

[54] CACHE MEMORY UTILIZING PSEUDO STATIC FOUR TRANSISTOR MEMORY CELL

[75] Inventor: Moty Mehalel, Haifa, Israel

[73] Assignee: Intel Corporation, Santa Clara, Calif.

[21] Appl. No.: 252,320

[22] Filed: Jun. 1, 1994

[51] Int. Cl.$^6$ .............................. G11C 11/34; G11C 7/00
[52] U.S. Cl. .................. 365/154; 365/49; 365/203; 365/222
[58] Field of Search .......................... 365/154, 49, 156, 365/189.01, 174, 203, 222

[56] References Cited

U.S. PATENT DOCUMENTS 5,020,028  5/1991  Wanlass .................................. 365/154
5,068,825  11/1991  Mahant-Shetti et al. ................ 365/154
5,111,427  5/1992  Kobayashi et al. ........................ 365/49
5,325,508  6/1994  Parks et al. ............................ 365/49 X

*Primary Examiner*—David C. Nelms
*Assistant Examiner*—Son Dinh
*Attorney, Agent, or Firm*—Blakely, Sokoloff, Taylor & Zafman

[57] ABSTRACT

A four transistor memory cell having a pair of cross coupled transistors and a pair of pass gates is disclosed. The four transistor memory cell is refreshed by charge transfer between the bit lines the internal nodes during bit line precharge.

9 Claims, 8 Drawing Sheets

5,475,633

CACHE MEMORY UTILIZING PSEUDO STATIC FOUR TRANSISTOR MEMORY CELL

BACKGROUND OF THE INVENTION

1. Field of the Invention

The present invention pertains to the field of integrated circuit devices. More particularly, this invention relates to a four transistor memory cell for memory circuits.

2. Background

A typical prior cache memory comprises an array of six transistor static random access memory (SRAM) cells. Each six transistor SRAM cell typically comprises a pair of cross coupled inverter circuits and a pair of pass gates. The cross coupled inverter circuits typically include pull-up transistors. The pull-up transistors prevent leakage currents in the SRAM cell from discharging of the data stored in the SRAM cell.

FIG. 1 illustrates a typical prior six transistor SRAM cell 10. The SRAM cell 10 comprises a set of six transistors Q1–Q6. The transistors Q1 and Q2 and the transistors Q3 and Q4 are arranged as cross coupled inverter circuits. The pass gate transistors Q5 and Q6 enable charge transfers between a pair of bit lines 14 and a pair of data storage nodes 15 and 16. The transistors Q5 and Q6 are activated via a word line 12.

The transistors Q1 is a pull-up transistor for the node 15, and the transistor Q3 is a pull-up transistor for the node 16. The pull-up transistors Q1 and Q3 prevent leakage currents in the SRAM cell 10 from discharging the node that stores the high level between accesses to the SRAM cell 10. As a consequence, the SRAM cell 10 does not require refreshing.

Unfortunately, the pull-up transistors Q1 and Q3 increase the integrated circuit die area required to implement the SRAM cell 10. Moreover, the aggregate of the pull-up transistors such as transistors Q1 and Q3 of each SRAM cell greatly increases the integrated circuit die area for such an SRAM.

In addition, such large SRAM cells severely limit the size of SRAM cache that can be implemented on chip with a processor. Moreover, such SRAM cells yield a decreased bit density for an SRAM implemented on a fixed area of an integrated circuit die.

Other prior SRAMs implement four transistor SRAM cells that do not employ pull-up transistors at the data storage nodes. Such prior four transistor SRAM memory cells employ extremely high resistive loads to accomplish the function of the pull-up transistors. Such high resistive loads are typically in the range of teraohms. Unfortunately, the manufacturing process for such SRAMs requires special masking layers. The special masking layers for the high resistive loads greatly increases the manufacturing cost of such SRAMs. In addition, such special masking layers are typically unsuitable for the process technology employed for manufacturing processor chips, thereby precluding the use of such SRAMs on chip with a processor.

SUMMARY AND OBJECTS OF THE INVENTION

One object of the present invention is to provide a four transistor memory cell.

Another object of the present invention is to reduce integrated circuit die area required to implement memories by providing a four transistor memory cell.

Another object of the present invention is to refresh the four transistor memory cell without causing access delay to the memory cell.

A further object of the present invention is to provide a four transistor memory cell suitable for placement on an integrated circuit for a processor.

These and other objects of the invention are provided by a memory cell comprising a pair of cross coupled transistors that store a data bit at a first node and a second node, and further comprising a pair of pass gates that couple charge between the first node and a first bit line and between the second node a second bit line. The first and second nodes are refreshed by transferring charge between the first and second bit lines to the first and second nodes during bit line precharge.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
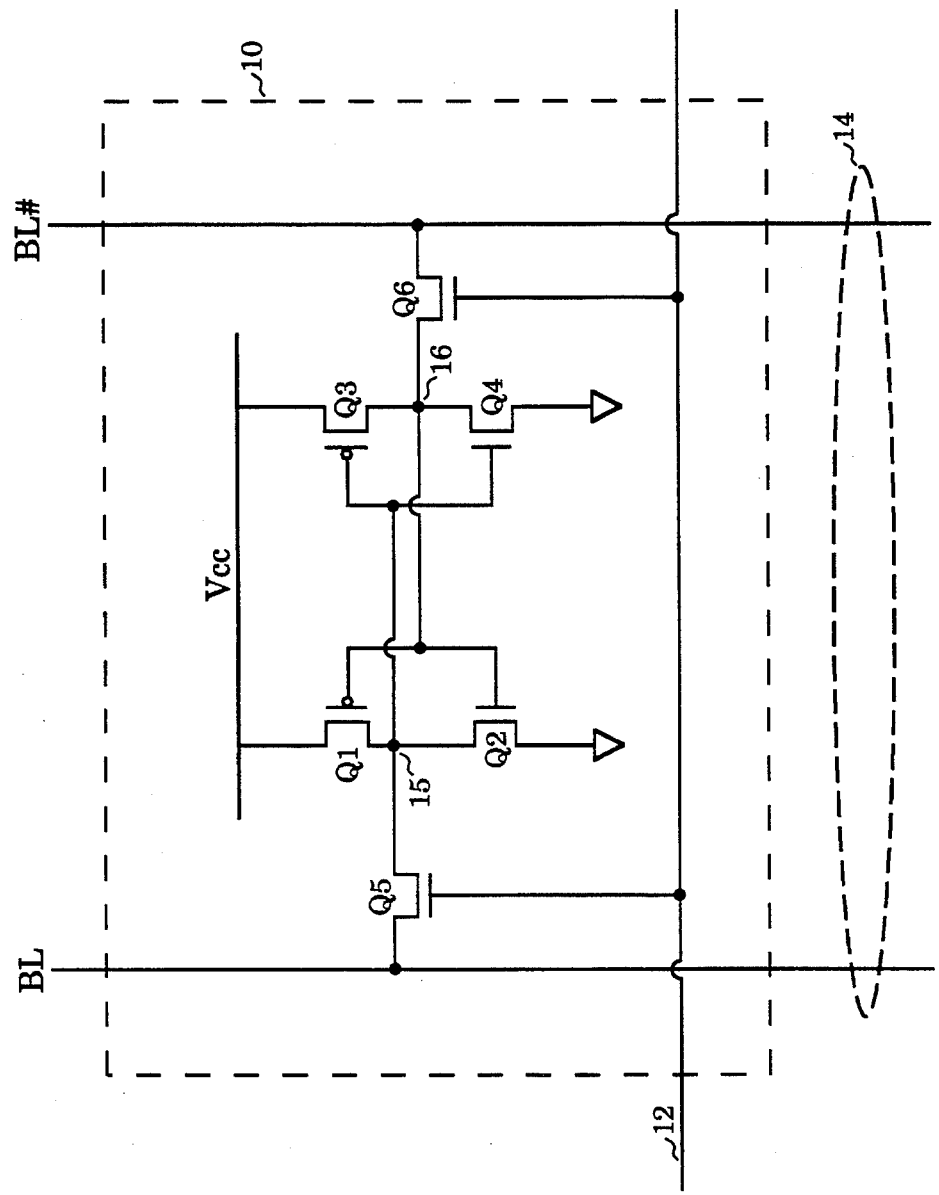
FIG. 1 illustrates typical prior six transistor SRAM cell comprising a pair of cross coupled inverters and a pair of pass gates.
Figure 2:
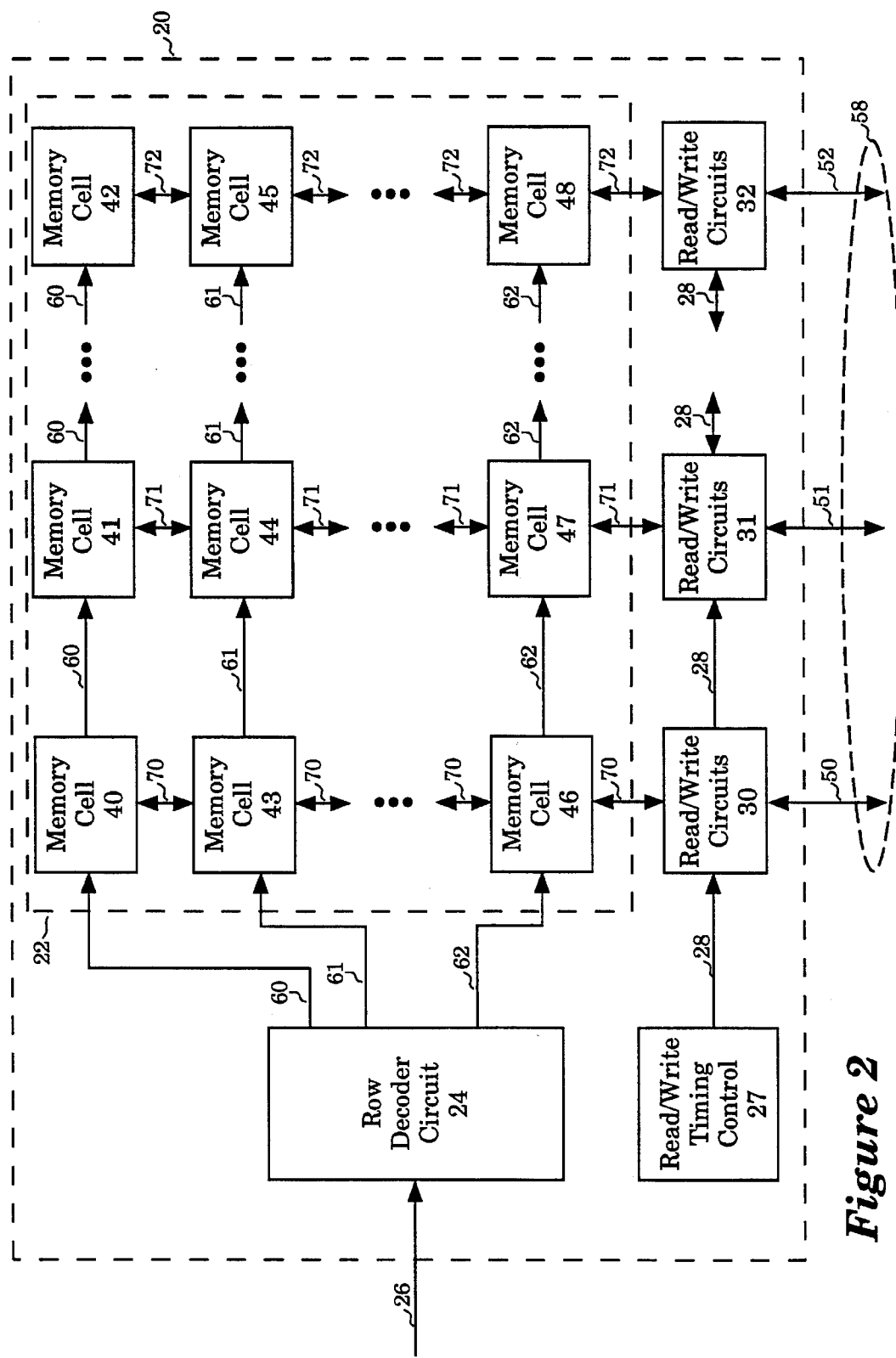
FIG. 2 illustrates a cache memory for one embodiment which comprises a row decoder circuit, a set of read/write circuits, and a memory cell array.

FIG. 2 illustrates a cache memory 20 for one embodiment. The cache memory 20 comprises a row decoder circuit 24, a set of read/write circuits 30– 32, a read/write timing control circuit 27, and a memory cell array 22. The memory cell array 22 comprises a set of memory cells 40–48.

The row decoder circuit 24 drives a set of word lines 60–62 of the memory cell array 22. The row decoder circuit 24 drives the word lines 60–62 to perform read and write operations to the memory cells 40–48. The row decoder circuit 24 also drives the word lines 60–62 during the bit lines precharge to perform refresh operations on the memory cells 40–48.

Each word line 60–62 corresponds to a row of the memory cell array 22. For example, the word line 60 corresponds to a row of the memory cell array 22 comprising the memory cells 40–42. Similarly, the word line 61 corresponds to a row of the memory cell array 22 comprising the memory cells 43–45, and the word line 62 corresponds to a row comprising the memory cells 46–48.

The read/write circuits 30–32 are coupled to sets of bit lines 70–72 of the memory cell array 22. The read/write circuits 30–32 differentially sense data on the bit lines 70–72 during read operations on the memory cell array 22. The read/write circuits 30–32 drive data onto the bit lines 70–72 during write operations to the memory cell array 22. In addition, the read/write circuits 30–32 drive the bit lines 70–72 to a high voltage level during precharge operations on the memory cell array 22. The precharge operations on the memory cell array 22 are controlled by a precharge control signal 28 which is generated by the read/write timing control circuit 27.

Each set of bit lines 70–72 comprises a pair of bit lines for a corresponding column of the memory cell array 22. For example, the bit lines 70 are coupled to a column of the memory cell array 22 comprising the memory cells 40, 43, and 46. Similarly, the bit lines 71 are coupled to a column comprising the memory cells 41, 44, and 47, and the bit lines 72 are coupled to a column comprising the memory cells 42, 45, and 48.

During write operations to the cache memory 20, the row decoder circuit 24 receives a write address over an address bus 26, and the read/write circuits 30–32 receive data over a data bus 58. Each read/write circuit 30–32 receives a data bit over the data bus 58. For example, the read/write circuit 30 receives a data bit 50, the read/write circuit 31 receives a data bit 51, and the read/write circuit 32 receives a data bit 52.

The read/write circuits 30–32 drive the received data onto the bit lines 70–72. The row decoder circuit 24 drives one of the word lines 60–62 according to the write address received over the address bus 26 during the write operation. The activated word line 60–62 determines the row of the memory cell array 22 that is written with the data received over the data bus 58.

During read operations on the cache memory 20, the row decoder circuit 24 receives a read address over the address bus 26. The row decoder circuit 24 decodes the received read address, and drives the appropriate word line 60–62. The activated word line 60–62 causes the corresponding row of the memory cell array 22 to drive data onto the bit lines 70–72. The read/write circuits 30–32 each detect a voltage differential on the corresponding bit lines 70–72 and amplify the voltage differential. The read/write circuits 30–32 then drive the sensed data from the memory cell array 22 over the data bus 58.

The read/write circuits 30–32 perform precharge operations on the bit lines 70–72 between read and write accesses of the cache memory 20. The precharge operations on the bit lines 70–72 increase the access speed for the memory cell array 22 during subsequent read and write operations.

The row decoder circuit 24 periodically overlaps a refresh cycle on the memory cell array 22 with a precharge operation on the bit lines 70–72. The row decoder circuit 24 overlaps a refresh cycle with a precharge operation by activating the word lines 60–62 during the precharge operation on the bit lines 70–72. The activated word lines 60–62 provide a set of corresponding refresh pulses for the memory cell array 22 during the precharge operation.

For one embodiment the refresh cycles occur in the cache memory 20 at one millisecond intervals. The refresh pulses generated on the word lines 60–62 each have a pulse width of 2 nanoseconds.

Figure 3:
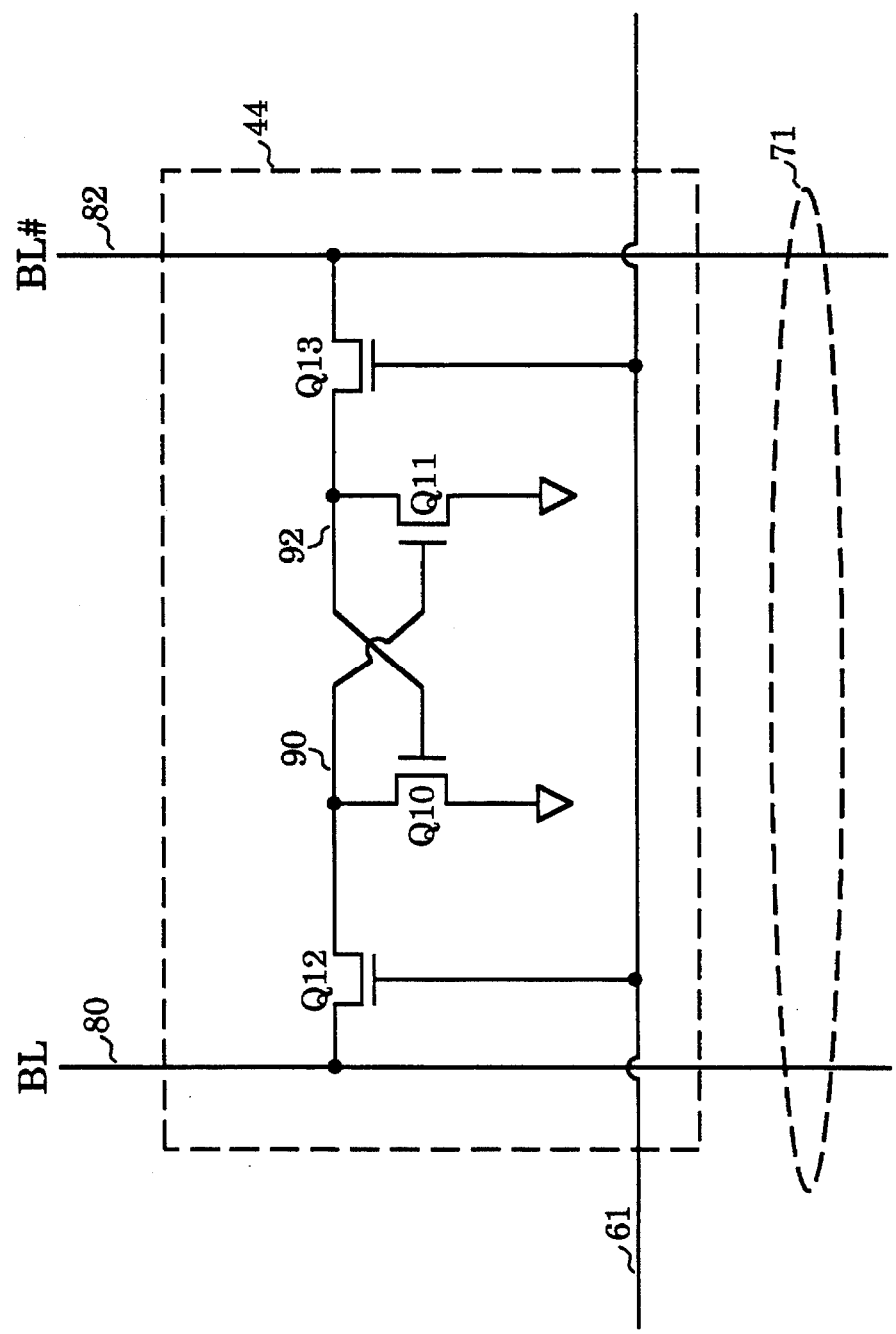
FIG. 3 illustrates a memory cell for one embodiment comprising a set of four transistors.

FIG. 3 illustrates the memory cell 44 for one embodiment. The memory cells 40–43, and 45–48 are substantially similar to the memory cell 44. The memory cell 44 comprises a set of four transistors Q10–Q13. The Transistors Q10 and Q11 are cross coupled to store charge at a node 90 and a node 92. The node 90 stores a "1" data state, and the node 92 stores a "0" data state.

The bit lines 71 comprise a bit line (BL) 80 and an inverted bit line (BL#) 82. The transistor Q12 is a pass gate that couples charge between the bit line 80 and the node 90. The transistor Q13 is a pass gate that couples charge between the bit line 82 and the node 92. The transistors Q12 and Q13 are controlled via the word line 61.

The node 90 of the memory cell 44 is floating because of the absence of pull-up transistors at the nodes 90 and 92. The periodic refresh cycle on the memory cell 44 overcomes the loss of charge at the node 90 caused by leakage current from the node 90 to the substrate voltage $V_{SS}$.

A read cycle to the memory cell 44 also performs a refresh cycle on the memory cell 44. At the start of a read access to the memory cell 44, the row decoder circuit 24 activates the word line 61 and the read/write circuit 31 precharges the bit lines 80 and 82 to a high voltage level. The voltage at the node 92 is low enough at that time to prevent the transistor Q10 from switching on. The activated word line 61 turns on the transistor Q12 and electrical current flows to the node 90 and charges the node 90 to a voltage level substantially equal to the supply voltage $V_{CC}$ minus the transistor threshold voltage ($V_t$).

During a precharge operation on the bit lines 80 and 82 the charge source for the node 90 is the source voltage $V_{CC}$ delivered by precharge transistors contained in the read/write circuit 31. If the bit lines 80 and 82 are not undergoing a precharge operation, the charge source for the node 90 is the capacitance of the bit lines 80 and 82. As a consequence, the data stored in the memory cell 44 at the nodes 90 and 92 is refreshed by activating the word line 61 during a precharge operation on the bit lines 80 and 82 or after a precharge operation on the bit lines 80 and 82.

The precharge interval for the memory cell 44 is a dead time for accesses to the cache memory 20. The dead time provided by the precharge intervals is used to perform refresh cycles on the memory cell 44. As a consequence, the refresh cycles do not delay memory accesses to the cache memory 20.

Figure 4:
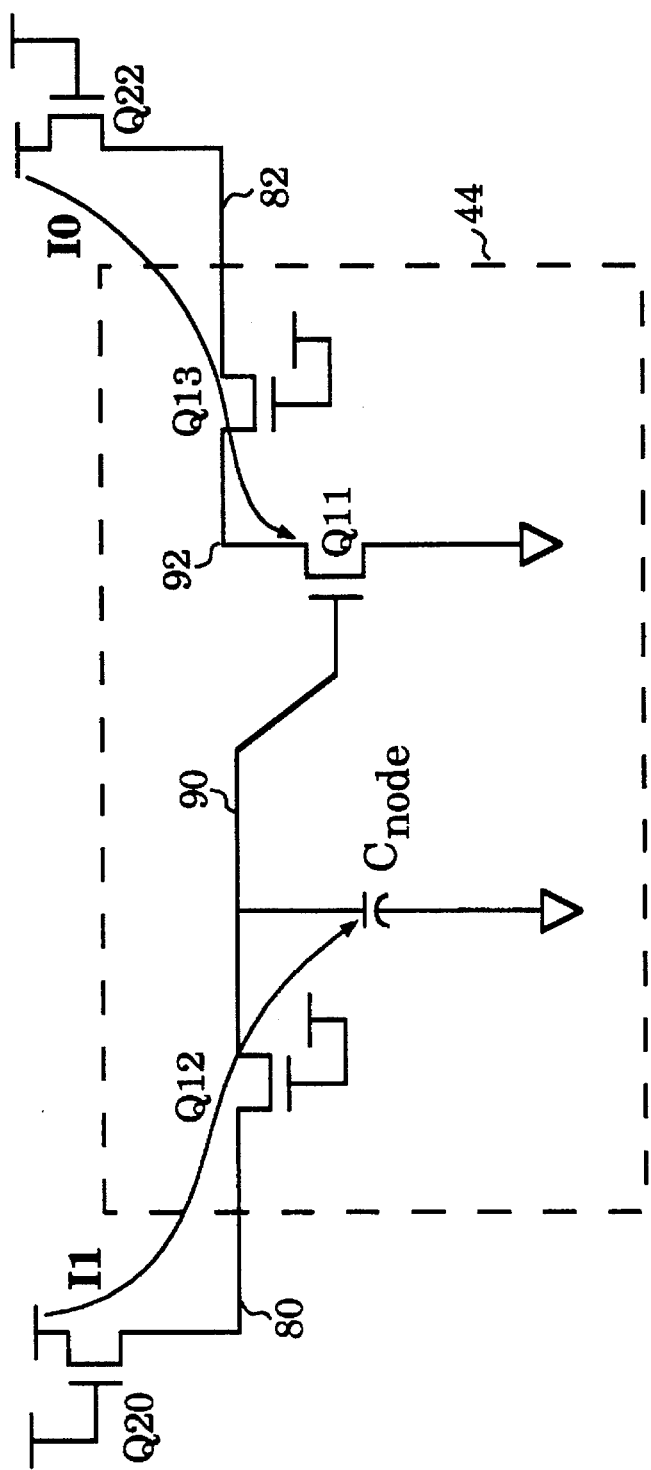
FIG. 4 shows an equivalent schematic of the memory cell during a refresh cycle.

FIG. 4 shows an equivalent schematic of the memory cell 44 during a refresh cycle. The capacitance at the node 90 is represented by a capacitor $C_{node}$. The transistors Q20 and Q22 represent precharge devices contained in the read/write circuit 31.

The word line 61 is activated during the refresh cycle on the memory cell 44. The activated word line 61 switches on the transistors Q12 and Q13. An electrical current I0 flows through the transistor Q22 through the transistors Q13 and Q11 as shown. An electrical current I1 flows through the transistor Q20 and the transistor Q12 to charge up the voltage at the node 90 as shown.

Figure 5:
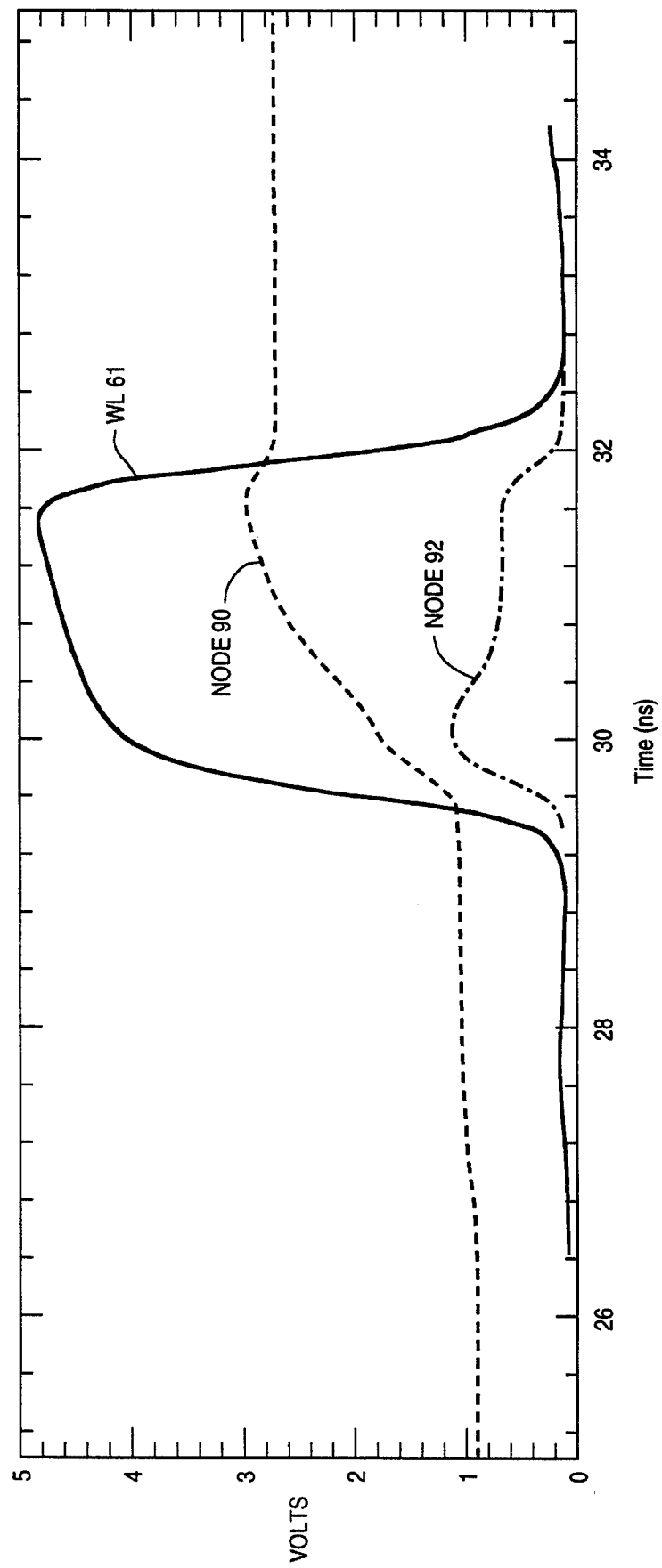
FIG. 5 illustrates the voltages at the internal nodes of the memory cell during a refresh cycle on the memory cell which is controlled by a refresh pulse on a word line.

FIG. 5 illustrates the voltages at the nodes 90 and 92 of the memory cell 44 during a refresh cycle. The refresh cycle on the memory cell 44 is controlled by a refresh pulse as shown on the word line (WL) 61 from the row decoder circuit 24. The refresh pulse on the word line 61 charges the node 90 to a high voltage level and by that the lost charge is restored.

Figure 6:
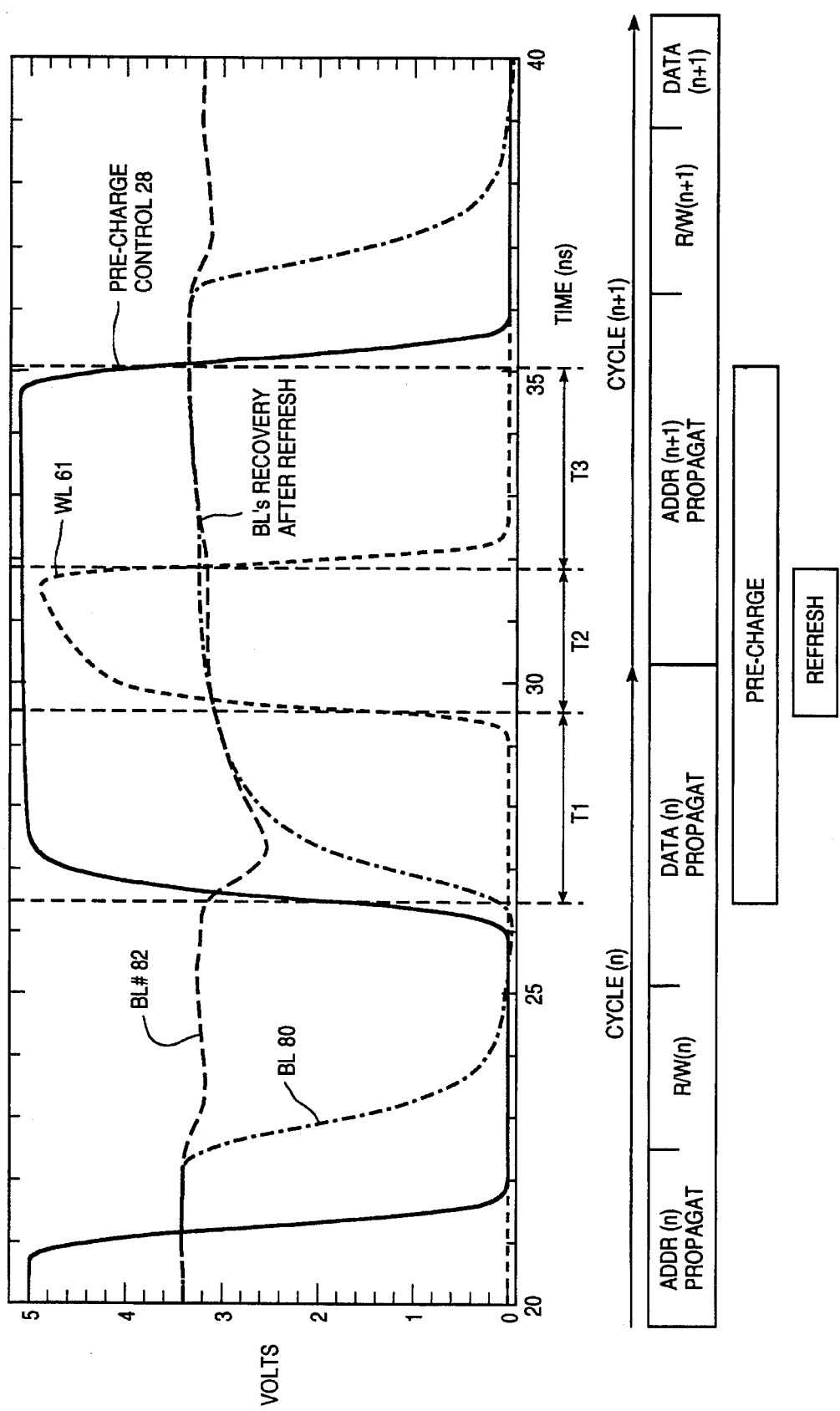
FIG. 6 illustrates the refresh cycle on the memory cell between read and write accesses to the cache memory and illustrates the voltage levels on the bit lines, the word line, and the precharge control signal.

FIG. 6 illustrates a refresh cycle on the memory cell 44 between read and write accesses to the cache memory 20. The diagram illustrates the voltage levels on the bit lines (BL) 80 and (BL#) 82 along with the word line (WL) 61 and the precharge control signal 28.

The refresh cycle on the memory cell 44 occurs during a precharge operation on the memory cell 44. The duration of a precharge operation on the memory cell 44 is determined by the width of a pulse on the precharge control signal 28. The precharge operation comprises a set of three precharge phases t1–t3.

During the precharge phase t1, the row decoder circuit 24 deactivates the word line 61. The read/write circuit 31 precharges the bit lines 80 and 82 to reduce the voltage differential. At the end of the precharge phase t1, the voltage differential on the bit lines 80 and 82 is less than the trip point for the memory cell 44, thereby avoiding a reversal of data during the start of the refresh cycle.

During the precharge phase t2, the row decoder circuit 24 activates the word line 61 to indicate the refresh cycle. The activated word line 61 during the precharge phase t2 refreshes the memory cells on the corresponding row of the memory cell array 22 including the memory cell 44. At the end of the precharge phase t2, the voltage at the node 90 is substantially equal to the source voltage minus the transistor threshold voltage ($V_{CC}-V_t$).

During the precharge phase t3, the row decoder circuit 24 deactivates the word line 61 and the voltages on the bit lines 80 and 82 are equalized. The precharge phase t3 is provided to minimize the impact of the refresh cycle on access time to the cache memory 20 during a subsequent read cycle.

During later refresh cycles on the memory cell array 22, the row decoder circuit 24 activates the remaining word lines 60–62 in sequence to refresh the other rows of the memory cell array 22.

Figure 7:
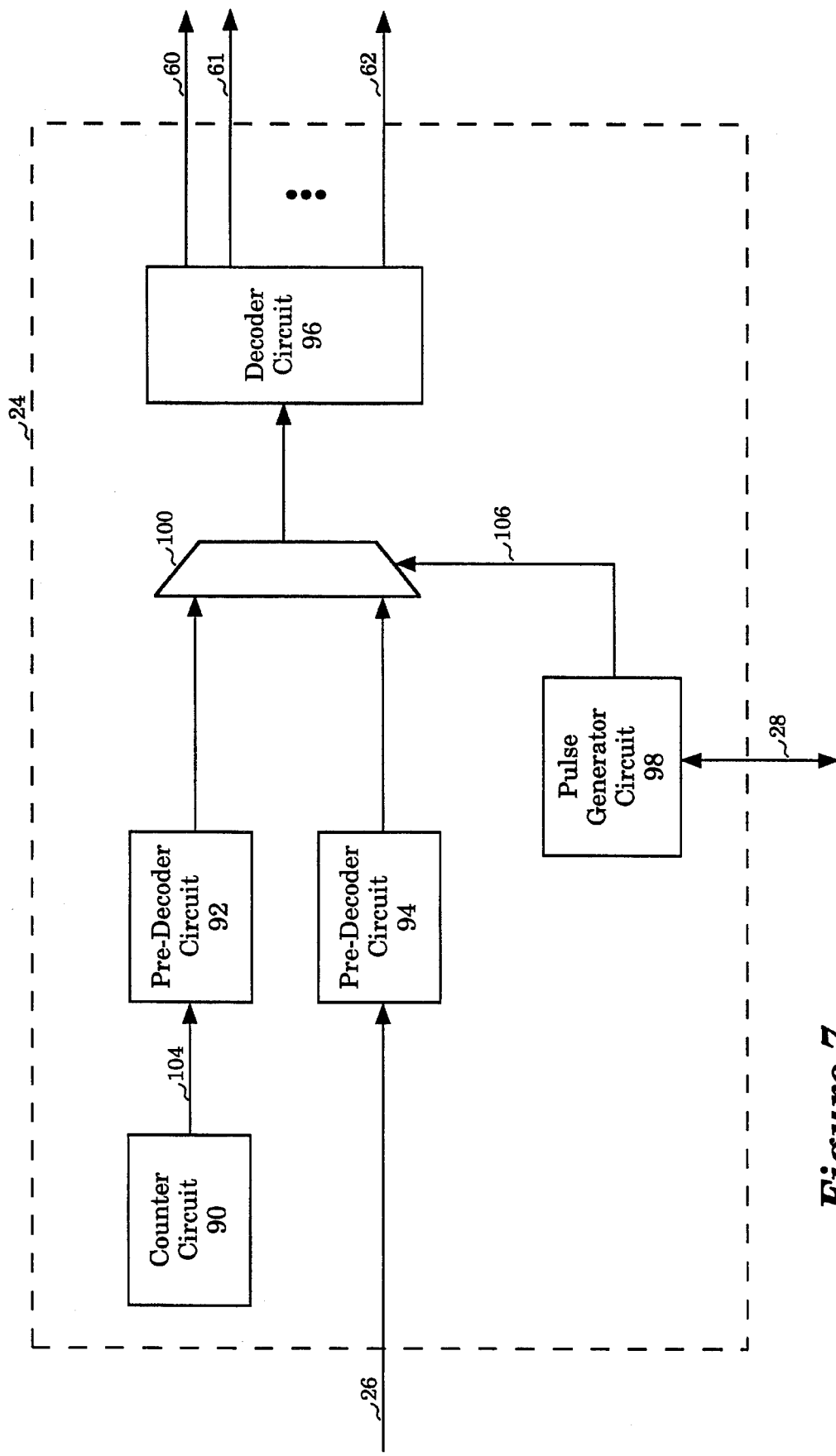
FIG. 7 illustrates an example of how the refresh mechanism may be implemented for one embodiment which comprises a counter circuit, a pair of pre decoder circuits, a pulse generator circuit, and a decoder circuit.

FIG. 7 illustrates an example of how the refresh mechanism may be implemented. The row decoder circuit 24 comprises a counter circuit 90, a pair of pre decoder circuits 92 and 94, a pulse generator circuit 98 and a decoder circuit 96.

The pre decoder circuit 94 decodes addresses received over the address bus 26. The pre decoder circuit 94 provides the decoded addresses to a multiplexer 100.

The counter circuit 90 is a free running counter that generates a series of refresh addresses 104 for the memory cell array 22. The pre decoder circuit 92 decodes the refresh addresses 104 and provides the decoded refresh addresses to the multiplexer 100.

The decoder circuit 96 receives pre decoded addresses from the multiplexer 100. The decoder circuit 96 accordingly drives the word lines 60– 62 to perform read and write access operations and refresh cycles on the memory cell array 22.

The pulse generator circuit 98 generates a control signal 106 to control the selections of the multiplexer 100. The precharge control signal 28 causes the pulse generator circuit 98 to generate a refresh pulse as the control signal 106. The refresh pulse for the control signal 106 causes the multiplexer 100 to select a pre decoded refresh address from the pre decoder circuit 92 for transfer to the decoder circuit 96. The pre decoded refresh address causes the decoder circuit 96 to generate a refresh pulse over the appropriate word line 60–62 according to the refresh address.

Figure 8:
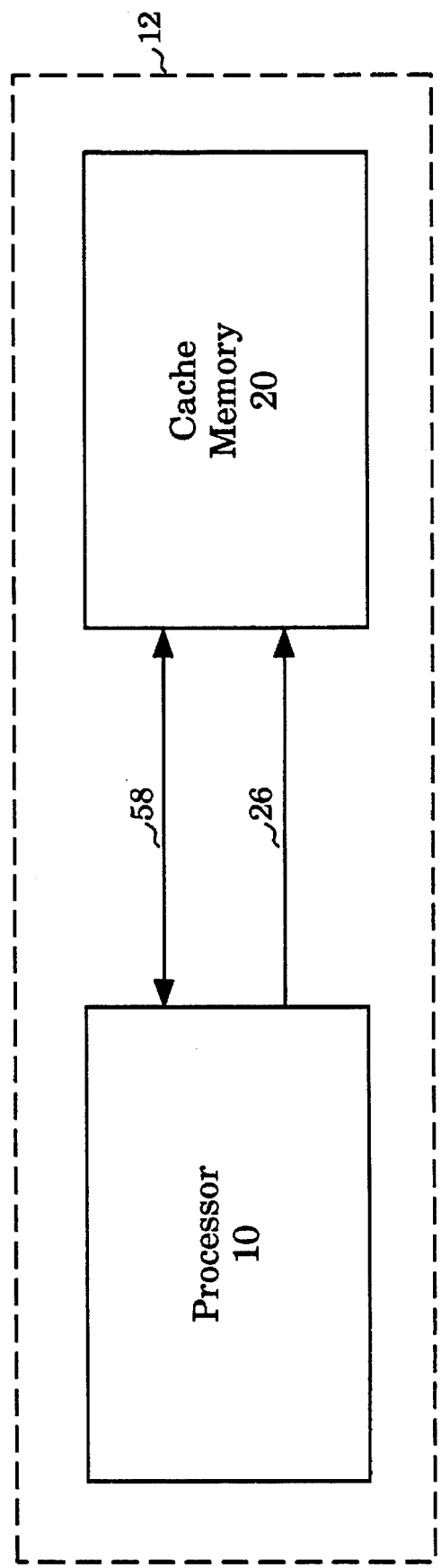
FIG. 8 illustrates a integrated circuit die 12 that contains a processor 10 and the cache memory 20.

FIG. 8 illustrates an integrated circuit die 12 that contains a processor 10 and the cache memory 20. The four transistor memory cells of the cache memory 20 enable the implementation of a relatively large cache memory on the integrated circuit die 12 using a process technology for implementing the processor 10.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A cache memory comprising:

an array of memory cells arranged in rows and columns, each row having a word line and each column having a first bit line and a second bit line, each memory cell having a first transistor coupled between a first node and a first operating potential; a second transistor coupled between a second node and the first operating potential, the gates of the first and second transistors being coupled to the second and first nodes, respectively, such that the first node stores a data bit and the second node stores a complement of the data bit; a third transistor coupled between the first bit line and the first node, the gate of the third transistor being coupled to the word line to selectively couple the first node to the first bit line; and a fourth transistor coupled between the second bit line and the second node, the gate of the third transistor being coupled to the word line to selectively couple the second node to the second bit line; and row decoder means for overlapping a refresh cycle on a memory cell in a selected column and row of the array during a precharge operation on the memory cell.

2. The cache memory of claim 1 wherein the row decoder means comprises:

a read/write (R/W) circuit providing a precharge voltage coupled to the first and second bit lines of the selected column during the precharge operation;

a timing control circuit coupled to the R/W circuit, the duration of the precharge operation being determined by a width of a timing pulse generated by the timing control circuit;

a row decoder circuit activating a word line coupled to the selected row of the array during the refresh cycle.

3. The cache memory of claim 2 further comprising:

a bus coupled to the R circuit, the W circuit driving differentially sensed data from the memory cell onto the bus during a read operation, and driving data onto the first and second bit lines from the bus during a write operation to the memory cell.

4. The cache memory of claim 2 wherein the precharge voltage is approximately equal to a second operating potential minus a voltage threshold of the second transistor.

5. The cache memory of claim 4 wherein the first operating potential is ground and the second operating potential is $V_{CC}$.

6. A method of operating a cache memory which comprises an array of memory cells arranged in rows and columns, each row having a word line and each column having a first and second bit lines, each memory cell having a first transistor coupled between a first node and a first operating potential, and a second transistor coupled between a second node and the first operating potential, the gates of the first and second transistors being coupled to the second and first nodes, respectively, such that the first node stores a data bit and the second node stores a complement of the data bit, the method comprising the steps of:

(a) deactivating a word line of a selected row in the array;

(b) precharging first and second bit lines of a selected column in the array to a precharge voltage level, the selected row and column identifying a memory cell of the array;

(c) activating the word line of the selected row so that charge flows to the first node of the memory cell from the first bit line of the selected column, thereby refreshing the first node;

(d) deactivating the word line of the selected row.

7. The method of claim 6 further comprising the step of:

(e) equalizing the potentials of the first and second bit lines of the selected column.

8. The method of claim 7 further comprising the step of:

(f) accessing the memory cell to read the data bit stored at the first node.

9. A method of overlapping refresh and precharge operations between read/write accesses to a cache memory which comprises an array of memory cells arranged in rows and columns, each row having a word line and each column having a first and second bit lines, each memory cell having a first transistor coupled between a first node and a first operating potential, and a second transistor coupled between a second node and the first operating potential, the gates of the first and second transistors being coupled to the second and first nodes, respectively, such that the first node stores a data bit and the second node stores a complement of the data bit, the method comprising the steps of:

(a) accessing a memory cell to read/write data on first and second bit lines of a selected column by activating a word line of a selected row in the array;

(b) deactivating the word line;

(c) providing a control pulse having a duration to a circuit which couples a high voltage to the first and second bit lines in response thereto;

(d) activating the word line so that charge flows to the first node of the memory cell from the first bit line of the selected column, thereby refreshing the first node;

(e) deactivating the word line prior to the end of the duration of the control pulse;

(f) re-accessing the memory cell to read/write data.

* * * * *